United States Patent [19]

Gomi

[11] Patent Number: 5,288,325
[45] Date of Patent: Feb. 22, 1994

[54] CHEMICAL VAPOR DEPOSITION APPARATUS

[75] Inventor: Hideki Gomi, Tokyo, Japan

[73] Assignee: NEC Corporation, Tokyo, Japan

[21] Appl. No.: 853,618

[22] Filed: Mar. 18, 1992

[30] Foreign Application Priority Data

Mar. 29, 1991 [JP] Japan .................. 3-66154

[51] Int. Cl.$^5$ .............................................. C23C 16/00
[52] U.S. Cl. ..................... 118/692; 118/710; 118/712; 118/715; 118/726
[58] Field of Search ............... 118/689, 692, 710, 712, 118/715, 726

[56] References Cited

U.S. PATENT DOCUMENTS

| | | | |
|---|---|---|---|
| 4,393,013 | 7/1983 | McMenamin | 261/648 |
| 4,625,678 | 12/1986 | Shioya | 118/724 |
| 4,761,269 | 8/1988 | Conger | 118/715 |
| 4,783,343 | 11/1988 | Sato | 427/8 |
| 5,000,113 | 3/1991 | Wang | 118/725 |

FOREIGN PATENT DOCUMENTS 259497  8/1988 German Democratic Rep. ................ 118/715
1-294868 11/1989 Japan ................ 118/715

OTHER PUBLICATIONS

Powell, Vapor Deposition, John Wiley & Sons, Inc. N.Y. ©1966, pp. 269-271.

*Primary Examiner*—Richard Bueker
*Attorney, Agent, or Firm*—Burns, Doane, Swecker & Mathis

[57] ABSTRACT

In a chemical vapor deposition apparatus in which a liquid raw material is vaporized by bubbling and the vaporized material is used as a raw material gas, an orifice is provided in a pipe between a reaction unit (a dispersion head) and a vaporizing unit (a bubbler), whereby the pressure in the vaporizing unit is controlled so that it is made higher than that in the reaction unit. Instability of the pressure in the vaporizing unit which occurs in the initial phase of film formation is eliminated so that the film formation can be stably performed.

6 Claims, 4 Drawing Sheets

CHEMICAL VAPOR DEPOSITION APPARATUS

BACKGROUND OF THE INVENTION

1. Field of the Invention

The present invention relates to a chemical vapor deposition apparatus and in particular to a chemical vapor deposition apparatus having a supply system for bubbling a liquid raw material to vaporize it and for stably supplying the resulting raw material gas to a reaction unit.

2. Description of Prior Art

A conventional chemical vapor deposition (hereinafter referred to as CVD) apparatus having a supply system for bubbling a liquid raw material to vaporize it and supplying the resulting raw material gas to a reaction unit is shown in FIG. 1. The flow rate of a bubbling gas passing through a bubbling gas supply pipe 8 is controlled by a mass flow controller 3 and the bubbling gas is introduced into a bubbler 1. The raw material gas which has been obtained by the vaporization of the raw material due to the bubbing in the bubbler 1 is fed to a heated introduction pipe 11 (due to a heater 9) together with the bubbling gas. When film formation is carried out, a change-over valve 5 is opened and a change-over valve 6 is closed to introduce the raw material gas into a reaction unit 4 for depositing films. On the other hand, when film formation is not performed, the change-over valve 5 is closed and the change-over valve 6 is opened to directly discharge the gas through a bypass line 12 to an exhaust pipe 7 without passing through the reaction unit 4.

The prior art CVD apparatus as shown in FIG. 1 has a problem that the flow rate of the raw material gas becomes unstable when the valves 5 and 6 are switched or changed over and as a result that it becomes impossible to stably grow the film.

The instability of the raw material gas flow rate when the valves are switched is caused by a phenomenon that the pressure in the bubbler fluctuates due to the difference in conductance between a bypass line 12 and the reaction unit 4.

The flow rate $Q_L$ of the raw material gas is theoretically given by the following formula:

$$Q_L = Q_B \cdot P_L / (P_O - P_L)$$

wherein $Q_B$ represents the flow rate of the bubbling gas; $P_L$ represents the vapor pressure of the liquid raw material; and $P_O$ represents the pressure in the bubber. The flow rate $Q_B$ of the bubbling gas is controlled by the mass flow controller 3 and the vapor pressure $P_L$ of the liquid raw material is controlled by controlling the temperature of the liquid raw material. In the prior art, however, a change in the conductance at the side of introduction pipe 11 causes the fluctuation of the pressure $P_O$ in the bubbler 1, resulting in an instability of the raw material gas flow rate $Q_L$. In order to obtain the stable flow rate of the raw material gas, it is necessary to suppress the fluctuations of the pressure in the bubbler 1 caused by the change in pressure in the reaction unit 4.

SUMMARY OF THE INVENTION

It is an object of the present invention to provide a chemical vapor deposition (CVD) apparatus in which the flow rate of a raw material gas is stable.

In order to attain the above object, there is provided a CVD apparatus including a liquid raw material vaporizing unit for vaporizing a liquid raw material by bubbling into a raw material gas for depositing a film and a reaction unit for depositing a film on a substrate, wherein it comprises controlling means for controlling the pressure in the liquid raw material vaporizing unit so that the pressure is higher than that in the reaction unit.

The liquid raw material includes all the known liquid raw material which can be used in a CVD method. The bubbling gas includes an inert gas such as $N_2$ or He gas.

BRIEF DESCRIPTION OF THE DRAWINGS

The aforementioned and other objects, features and advantages of the present invention will become more apparent from the following description taken with reference to the accompanying drawings, wherein.

DESCRIPTION OF THE PREFERRED EMBODIMENTS

The present invention will be described with reference to the accompanying drawings.

Figure 1:
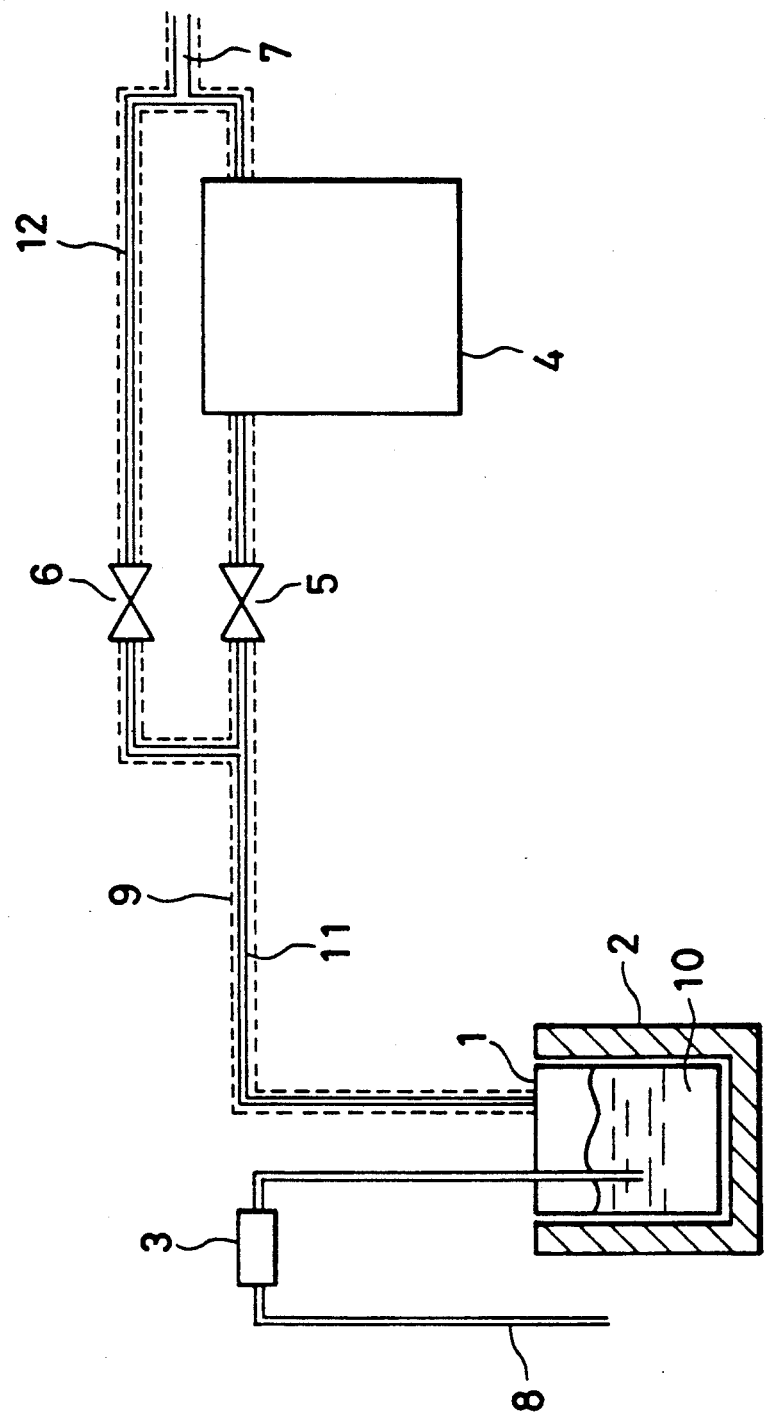
FIG. 1 shows a schematic view of a prior art chemical vapor deposition (CVD) apparatus.
Figure 2:
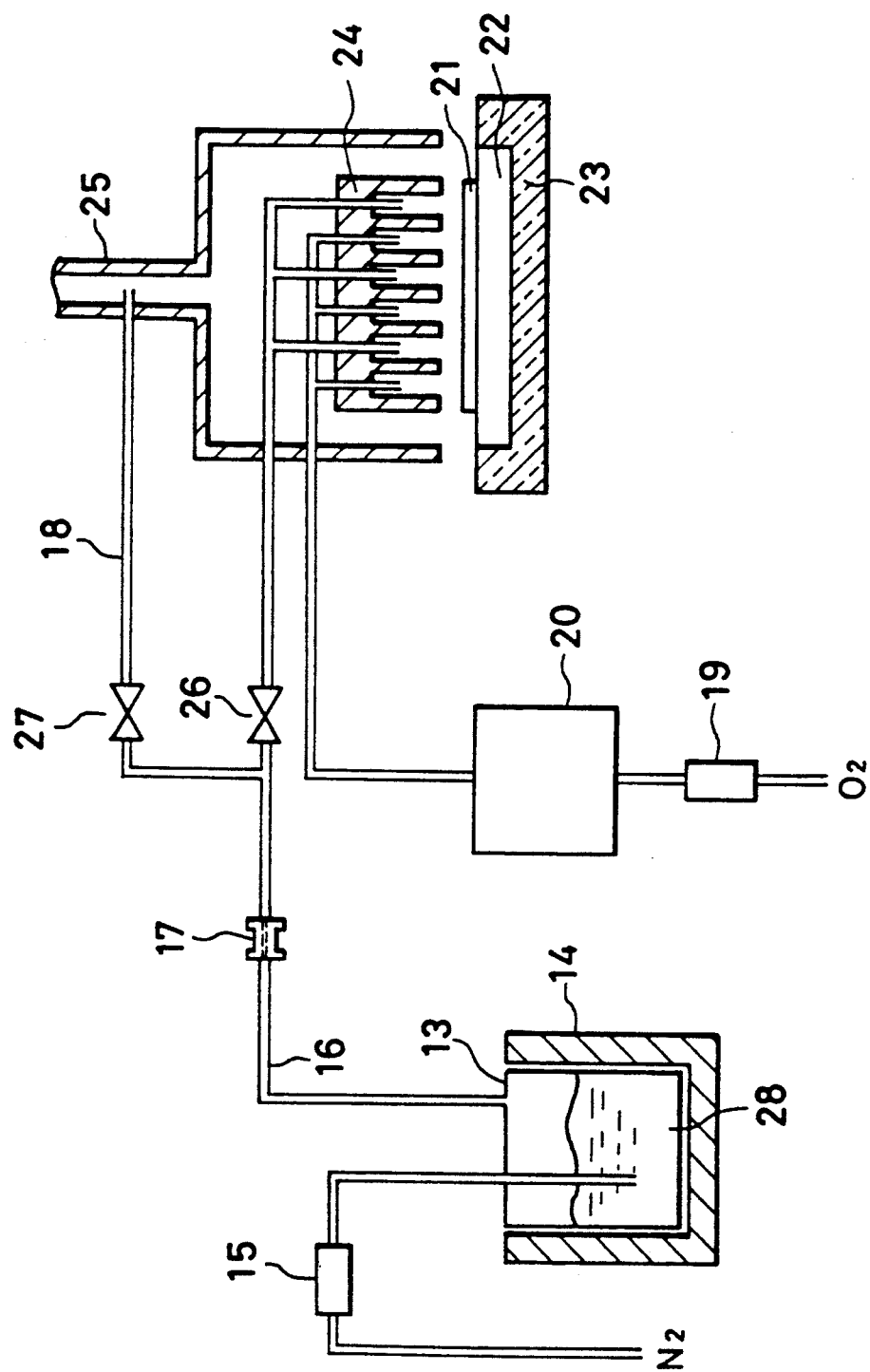
FIG. 2 shows a schematic view of an atmospheric pressure CVD apparatus of the first embodiment according to the present invention.

Referring now to FIG. 2, there is shown a schematic view of a dispersion plate type atomspheric pressure CVD apparatus of the first embodiment according to the present invention. According to the apparatus, a silicon oxide film is deposited by using tetraethyl orthosilicate (hereinafter referred to as TEOS) as a liquid raw material and ozone as an oxidizing agent. The other known oxidizing agent which is used in the CVD method may be used. A reference numeral 13 represents a bubbler for vaporizing TEOS (a reference numeral 28) and a reference numeral 14 represents a heater for heating TEOS so that the temperature of TEOS is maintained at about 65° C. $N_2$ used as a bubbling gas for TEOS is controlled by a mass flow controller 15 and is introduced into the bubbler 13. Some of TEOS which is bubbled in the bubbler 1 is vaporized and the mixture gas of TEOS with $N_2$ is fed to an introducing pipe 16.

The introducing pipe 16 is provided with an orifice 17 having a low conductance, whereby the conductance of the introducing pipe 16 is made lower than those of a bypass line 18 and a dispersion head 24. This enables the pressure in the bubbler 13 to become higher than those in the dispersion head 24 and the bypass line 18.

When film formation is not performed, the mixture gas of TEOS with $N_2$ is directly discharged to an exhaust pipe 25 through the bypass line 18. When the film formation is performed, a change-over valve 27 is closed while a change-over valve 26 is opened so that the TEOS and $N_2$ mixture gas is introduced into the dispersion head 24. The mixture gas reacts with ozone gas above a substrate 21, such as a silicon substrate, which is mounted on a susceptor 23 to deposit a silicon oxide film. The above ozone gas is generated in an ozonizer 20 in which $O_2$ gas controlled by a mass flow controller 19 is introduced at a prescribed flow rate, and is introduced near the substrate.

In order to prevent TEOS from condensating, the pipe is maintained at the required temperature. For example, the pipe is heated by a heater in a controlled manner so that the temperatures of the pipes from the bubbler 13 to the orifice 17 and from the orifice 17 to the dispersion head 24 are about 70° C. and about 80° C., respectively.

The fluctuations of pressure caused by the difference in conductance when the mixed gas is changed over from the bypass line 18 to the dispersion head 24 is mitigated due to the orifice 17 so that the pressure fluctuations in the bubbler 13 are hardly caused.

The pressure fluctuations in the bubbler is thus suppressed, whereby unstable supply of TEOS which occurs in an initial stage of film formation is eliminated and a stable deposition speed of the silicon oxide film can be obtained. The film quality of the deposited $SiO_2$ film is uniform in a thickness direction.

Figure 3:
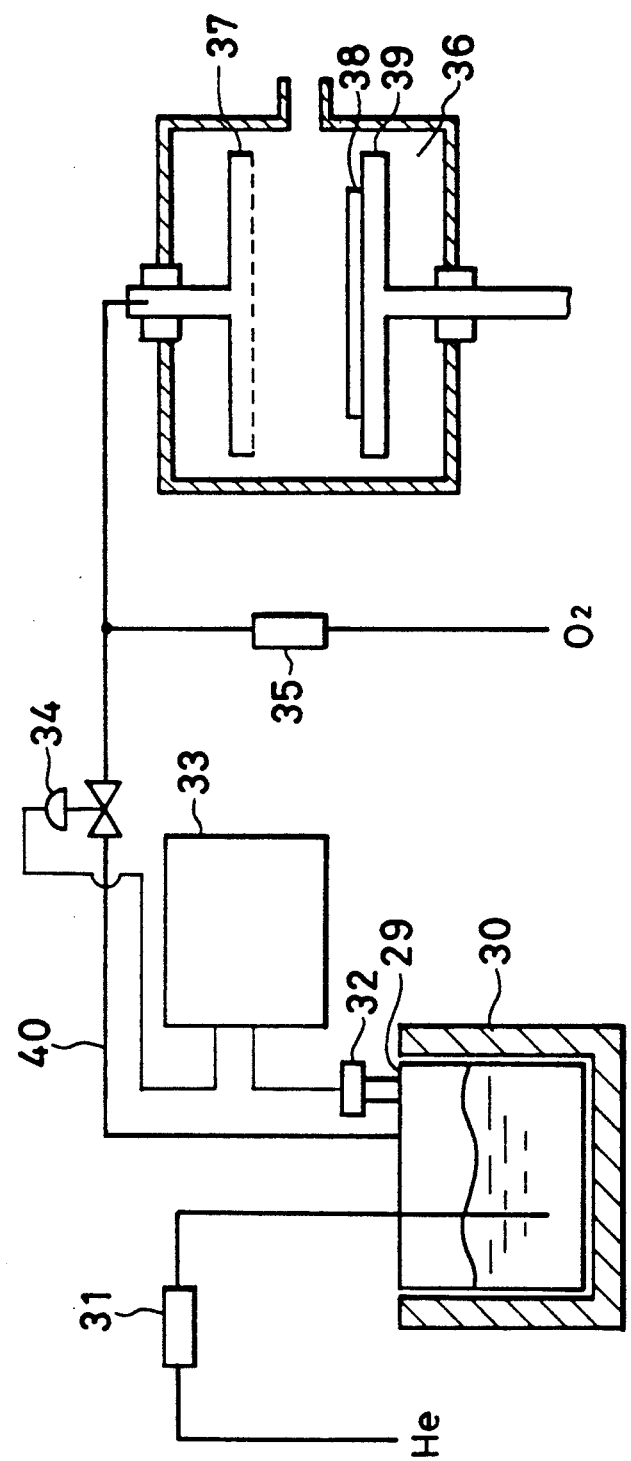
FIG. 3 shows a schematic view of a plasma CVD apparatus of the second embodiment according to the present invention.

Referring now to FIG. 3, there is shown a schematic view of a plasm CVD apparatus of the second embodiment according to the present invention in which TEOS and $O_2$ are used as a liquid raw material and an oxidizing agent, respectively.

A reference numeral 29 denotes a bubbler for vaporizing TEOS. TEOS is maintained at 37° C. in a constant temperature chamber 30. He gas which is used as a bubbling gas for TEOS is controlled by a mass flow controller 31 and is introduced into the bubbler 29. Some of TEOS which is bubbled in the bubbler 29 is vaporized and the mixture gas of TEOS with He is fed to an introducing pipe 40.

Prior to film formation, the TEOS-He mixture gas is mixed with $O_2$ which is introduced through a mass flow controller 35 at a preset flow rate and then is introduced into a reaction chamber 36 from a shower electrode 37. The preset flow rates of He and $O_2$ are 500 sccm. The pressure in the reaction chamber 36 is preset to a required pressure, for example, 9 Torr. The pressure in the bubbler 29 is detected by a pressure detector or sensor 32 and is controlled by a variable valve 34. The pressure in the bubbler 29 is preset to a required pressure which is higher than that in the reaction chamber 36, for example to 20 Torr by a pressure controller 33.

When film formation is performed, a high frequency electric power of 13.56 MHz and 500 W is applied to the shower electrode 37. On application of the high frequency waves, the raw material gas in the reaction chamber 36 is decomposed to cause a volume expansion. Accordingly, the pressure in the reaction chamber 36 is momentarily increased to about 15 Torr in the case that the pressure in the reaction chamber 36 is preset to 9 Torr and the pressure in the bubber 29 is preset to 20 Torr and then lowered to the preset pressure 9 Torr within several seconds by the pressure controller 33. In the reaction chamber 36, the reaction is carried out above a substrate 38, such as a silicon substrate, which is mounted on a susceptor 39, to deposit a silicon oxide film.

A prior art bubbling system having no pressure control system for the bubbler has a disadvantage that the increase in pressure on application of high frequency power is propagated to the bubbler and the amount of the vaporized TEOS is not only stabilized, but also pressure in the bubbler is momentarily reduced to a pressure lower than that in the reaction chamber, resulting in that the raw material gas flows backward.

In contrast to this, in the CVD apparatus of the present invention shown in FIG. 3, the raw material gas will not flow backward, since the pressure in the bubbler 29 is preliminarily set to 20 Torr. The recovery time of the pressure fluctuation in the bubbler 29 is shorter than that in the reaction chamber 36. This achieves the stable supply of TEOS.

Figure 4:
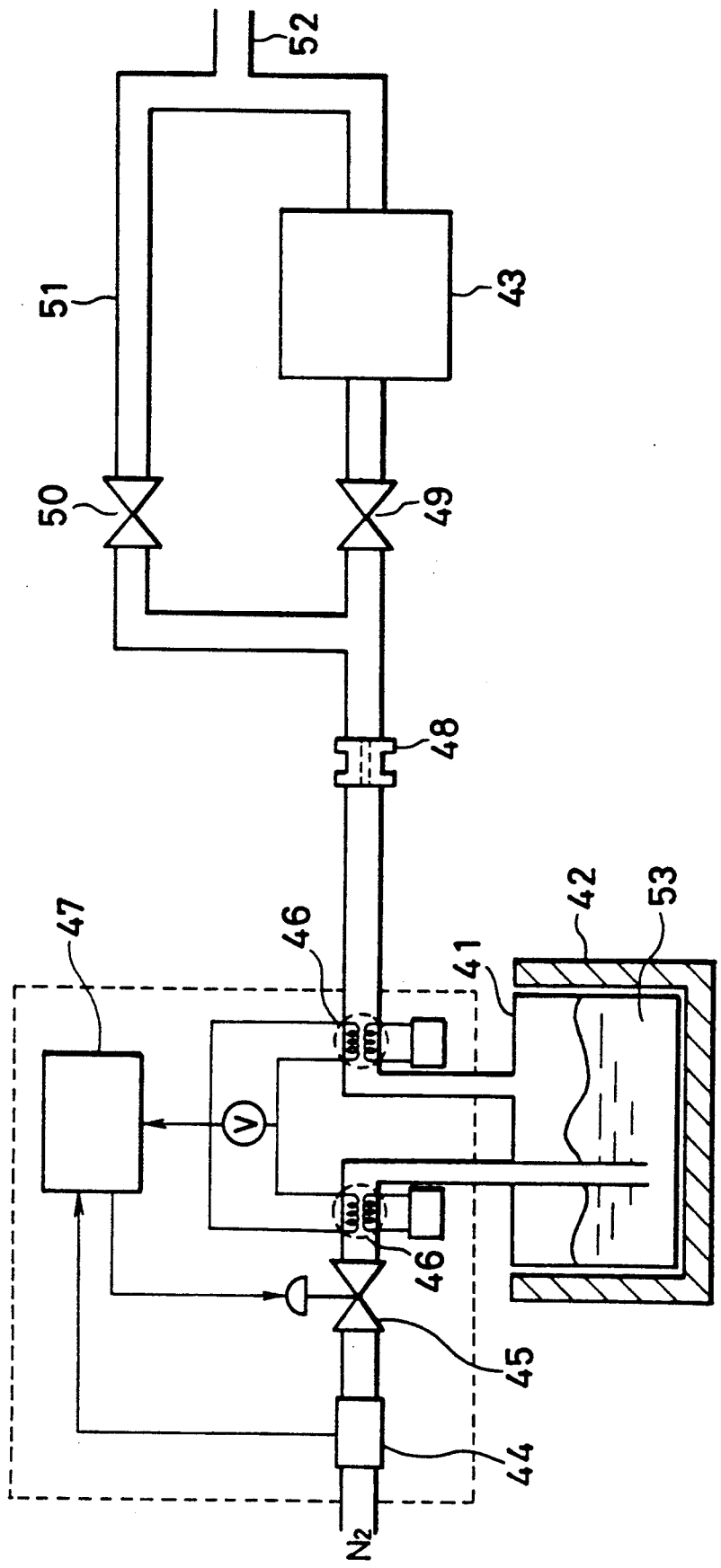
FIG. 4 shows a schematic view of a CVD apparatus of the third embodiment according to the present invention.

Referring now to FIG. 4, there is shown a schematic view of a CVD apparatus of the third embodiment according to the present invention in which TEOS is used as a liquid raw material and a controller for controlling the absolute flow rate of gas for bubbling the liquid raw material is used.

The thermal conductivity of gasses in the primary and secondary pipes for a bubbler 41 which is received in a constant temperature chamber 42 is detected by each of thermal conductivity sensors 46 so that TEOS gas concentration in the secondary pipe is determined. The flow rate of $N_2$ gas which constantly makes the flow rate of TEOS gas constant is computed on the basis of electrical signals from the sensors 46 and the flow rate of the bubbling $N_2$ gas (a signal from a mass flow meter 44) and the $N_2$ flow rate is controlled by a flow rate controller 45 on the basis of a signal from a controller 47. Using such a controller 45 for controlling the absolute flow rate of the gas for bubbling the liquid raw material makes it possible to always introduce a constant amount of the TEOS gas even if the temperature of TEOS in the bubbler 41 changes.

However, the control system utilizing the thermal conduction as mentioned above has a drawback that it is brought into an uncontrollable state for pressure fluctuation so that it can not follow the momentary pressure fluctuation.

Therefore, an orifice 48 is provided between a reaction unit 43 and the bubbler 41 so that the pressure in the bubbler 41 is higher than that in the reaction unit 43 and a bypass line 51. This makes it possible to prevent the pressure fluctuation which occurs when change-over valves 49 and 50 are changed over from propagating to the bubbler 41, resulting in that the controller 45 for controlling the absolute flow rate of the bubbling gas can be effectively used.

The pressure fluctuation in the bubbler 41 can be further suppressed by preliminarily equalizing the conductance of the reaction unit 43 to that of the bypass line 51.

An has been explained above in detail, the apparatus according to the present invention includes means for making the pressure in the vaporizing unit for the liquid raw material higher than that in the reaction unit, whereby the pressure fluctuation occurred at the side of the reaction unit is mitigated before it reaches the vaporizing unit so that the pressure fluctuation in the vaporizing unit is suppressed. This causes the raw material gas from the liquid raw material to be stably supplied to the reaction unit so that a stable film depositing speed and uniform film quality can be obtained.

What is claimed is:

1. An atmospheric pressure chemical vapor deposition apparatus comprising a liquid raw material vaporizing unit for vaporizing a liquid raw material by bubbling said liquid raw material, and a reaction unit for depositing, at atmospheric pressure, a film made from said vaporized raw material on a substrate and a pipe having a branch for exhaustion of said vaporized raw material and connecting said liquid raw material vaporizing unit with said reaction unit, said pipe having an orifice between the branching portion of said pipe and the connecting portion of said pipe with said liquid raw material vaporizing unit so as to control the pressure in said liquid raw material vaporizing unit resulting in said pressure being higher than that in said reaction unit.

2. An atmospheric pressure chemical vapor deposition apparatus as defined in claim 1 which further comprises a control system for controlling flow rate of a bubbling gas for said liquid raw material, said control system comprising a bubbling gas flow rate controller, thermal conductivity sensing means for determining the concentration of said raw material gas from said liquid raw material vaporizing unit and controlling means for controlling said controller on the basis of signals from said thermal conductivity sensing means and a mass flow meter for metering the flow rate of the bubbling gas.

3. An atmospheric pressure chemical vapor deposition apparatus as defined in claim 1 in which said reaction unit is provided with a dispersion head.

4. An atmospheric pressure chemical vapor deposition apparatus as defined in claim 1 in which said pipe has a pressure controlling means comprising pressure sensing means for detecting the pressure in said liquid raw material vaporizing unit and converting the detected pressure into an electrical signal and a variable valve for changing the conductance of a pipe between said vaporizing unit and said reaction unit in response to said electrical signal from the pressure sensing means, in which the pressure in said vaporizing unit is controlled by controlling said variable valve so that the pressure in said vaporizing unit is higher than that in said reaction unit.

5. An atmospheric pressure chemical vapor deposition apparatus comprising a mass flow controlling means for introducing a bubbling gas, a liquid raw material vaporizing unit for vaporizing a liquid raw material by bubbling said liquid raw material gas, heating means for keeping the temperature of said vaporizing unit constant, a mass flow controller for introducing an oxidizing agent, a reaction unit for depositing, at atmospheric pressure a film made from said vaporized raw material on a substrate and a pipe having a branch pipe for exhaustion of said vaporized raw material and connecting said liquid raw material vaporizing unit with said reaction unit, said pipe having an orifice between the branching portion of said pipe and the connecting portion of said pipe with said liquid raw material vaporizing unit so as to control the pressure in said liquid raw material vaporizing unit resulting in said pressure being higher than that in said reaction unit.

6. An atmospheric pressure chemical vapor deposition apparatus as defined in claim 5 in which said pressure controlling means comprises pressure sensing means for detecting the pressure in said liquid raw material vaporizing unit and converting the detected pressure into an electrical signal and a variable valve for changing the conductance of a pipe between said vaporizing unit and said reaction unit in response to said electrical signal from the pressure sensing means, in which the pressure in said vaporizing unit is controlled by controlling said variable valve so that the pressure in said vaporizing unit is higher than that in said reaction unit.

* * * * *